US006638857B1

(12) United States Patent
Chakrabarti

(10) Patent No.: US 6,638,857 B1
(45) Date of Patent: Oct. 28, 2003

(54) E-BEAM DEPOSITION METHOD AND APPARATUS FOR PROVIDING HIGH PURITY OXIDE FILMS

(75) Inventor: Utpal Kumar Chakrabarti, Allentown, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/538,690

(22) Filed: Mar. 30, 2000

(51) Int. Cl.[7] ............... H01L 21/44; H01L 21/3205; H01L 21/20; C23C 14/08; B32B 15/02
(52) U.S. Cl. ............... 438/677; 438/591; 438/785; 438/240; 438/287; 438/584; 427/529; 428/404; 204/192.12; 204/298.12
(58) Field of Search ............... 438/240, 287, 438/584, 591, 785, 676, 677, 678, 679, 787, 788; 427/529; 428/404

(56) References Cited

U.S. PATENT DOCUMENTS

| | | | | |
|---|---|---|---|---|
| 3,750,117 A | * | 7/1973 | Chen et al. ............... | 365/113 |
| 3,755,865 A | * | 9/1973 | Saldi ............... | 445/52 |
| 4,013,534 A | * | 3/1977 | Ishii et al. ............... | 204/192 |
| 4,842,891 A | * | 6/1989 | Miyazaki et al. ............... | 427/35 |
| 4,915,810 A | | 4/1990 | Kestigian et al. | |
| 5,055,319 A | * | 10/1991 | Bunshah et al. ............... | 427/567 |
| 5,158,931 A | * | 10/1992 | Noda et al. ............... | 505/1 |
| 5,444,006 A | * | 8/1995 | Han et al. ............... | 438/396 |
| 5,554,564 A | | 9/1996 | Nishioka et al. | |
| 5,554,866 A | | 9/1996 | Nishioka et al. | |
| 5,719,705 A | | 2/1998 | Machol | |
| 6,107,116 A | * | 8/2000 | Kariya et al. ............... | 438/87 |
| 6,153,271 A | * | 11/2000 | Mearini ............... | 427/529 |
| 6,214,712 B1 | * | 4/2001 | Norton ............... | 438/591 |
| 6,241,858 B1 | * | 6/2001 | Phillips et al. ............... | 204/192.15 |
| 6,265,353 B1 | * | 7/2001 | Kinder et al. ............... | 505/238 |
| 6,303,143 B1 | * | 10/2001 | Chrai et al. ............... | 424/451 |
| 6,333,111 B1 | * | 12/2001 | Murakami et al. ............... | 428/404 |
| 6,456,690 B2 | * | 9/2002 | Yamada et al. ............... | 378/119 |

FOREIGN PATENT DOCUMENTS

| | | | |
|---|---|---|---|
| JP | 354092271 A | * | 7/1979 |
| JP | 401246141 A | * | 10/1989 |
| JP | 404272608 A | * | 9/1992 |
| JP | 404272608 A | * | 9/1992 |

* cited by examiner

*Primary Examiner*—Matthew Smith
*Assistant Examiner*—Chuong Anh Luu
(74) *Attorney, Agent, or Firm*—Wendy W. Koba

(57) ABSTRACT

An e-beam deposition method and apparatus uses a metallic target and localized oxygen ambient to produce an oxide film for deposition. A metallic target is first heated, then exposed to a stream of oxide, resulting in the formation of a relatively thin layer of oxide on the metallic target surface. Since the oxide has a higher vapor pressure than the underlying metal, when the target is impinged by an electron-beam current, the oxide will preferentially vaporize and be deflected toward the surface to coated.

6 Claims, 2 Drawing Sheets

10

E-BEAM DEPOSITION METHOD AND APPARATUS FOR PROVIDING HIGH PURITY OXIDE FILMS

BACKGROUND OF THE INVENTION

The present invention relates to an e-beam deposition method and apparatus for oxide films and, more particularly, to the use of a metallic target and oxygen ambient to produce high purity oxide films.

DESCRIPTION OF THE PRIOR ART

Certain oxide films, for example, tantalum oxide, are often used as a dielectric coating for laser facets and other optic devices. Compared to various other coatings (such as silicon dioxide or silicon nitride), tantalum oxide has been found to provide superior optical and electrical qualities, as well as improved environmental stability when compared with other oxide materials. The conventional prior art practice of depositing tantalum oxide films utilizes tantalum oxide ($Ta_2O_5$) target material in an e-beam deposition chamber, the tantalum oxide target material being provided in granular, chunk or slug form. The target material is placed in a crucible and heated by electron impact to a temperature sufficient to produce a significant $Ta_2O_5$ vapor pressure.

E-beam deposition of oxide materials is typically troublesome for a number of reasons. First, the commercially available target oxide materials are not of high purity.

Additionally, oxides by their very nature are poor conductors of electrical current. In e-beam processing, this poor conduction quality produces surface charging of the target source material, making it extremely difficult to control the distribution of the e-beam current striking the target. As a result, the oxide target heats unevenly, producing irregular evaporation rates, spatially non-uniform flux distributions, and "tunneling" of the beam into the target material. All of these problems result in inefficient use of the oxide target material, as well as unpredictable flux distributions. As a result, the deposited oxide films are of relatively low purity and are often distributed in a non-uniform manner across the facet surface.

A need remains in the prior art, therefore, for an improved process of depositing oxide films, such as tantalum oxide, on exposed facet surfaces of optical devices.

SUMMARY OF THE INVENTION

The need remaining in the prior art is addressed by the present invention, which relates to an e-beam deposition method and apparatus for oxide films and, more particularly, to the use of a metallic target and oxygen ambient to produce high purity oxide films. In accordance with the present invention, a metallic target, such as tantalum or tungsten, is used as the source for the e-beam deposition process. The metallic target material is then heated and a gas source is used to supply a stream of oxygen over the surface of the heated target. The oxygen stream functions to oxidize a minimal surface depth of the metallic target, where the oxide layer is thick enough to allow for the vaporized oxide to escape the target upon application of an e-beam current. Since the vapor pressure of the oxide is approximately four orders of magnitude greater than the metal, the oxide will preferentially vaporize in the presence of the e-beam current. An advantage of the apparatus and method of the present invention is that commercially supplied metallic tantalum (or tungsten) is generally higher in purity than the prior art tantalum (tungsten) oxide targets, resulting in the deposition of a higher quality film. Further, since a metallic target, by its nature, is more conductive than an oxide target, the metallic target of the present invention will exhibit a significantly lower surface charge than the insulative prior art oxide target, resulting in reduced deflection of the incoming e-beam and improved uniformity of the beam current density across the surface of the target. Additionally, the improved thermal conductivity of the metallic target, when compared with the oxide target, allows for the heat to be spread more uniformly over the target surface, further improving the uniformity of the surface oxide generation.

Other and further advantages of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
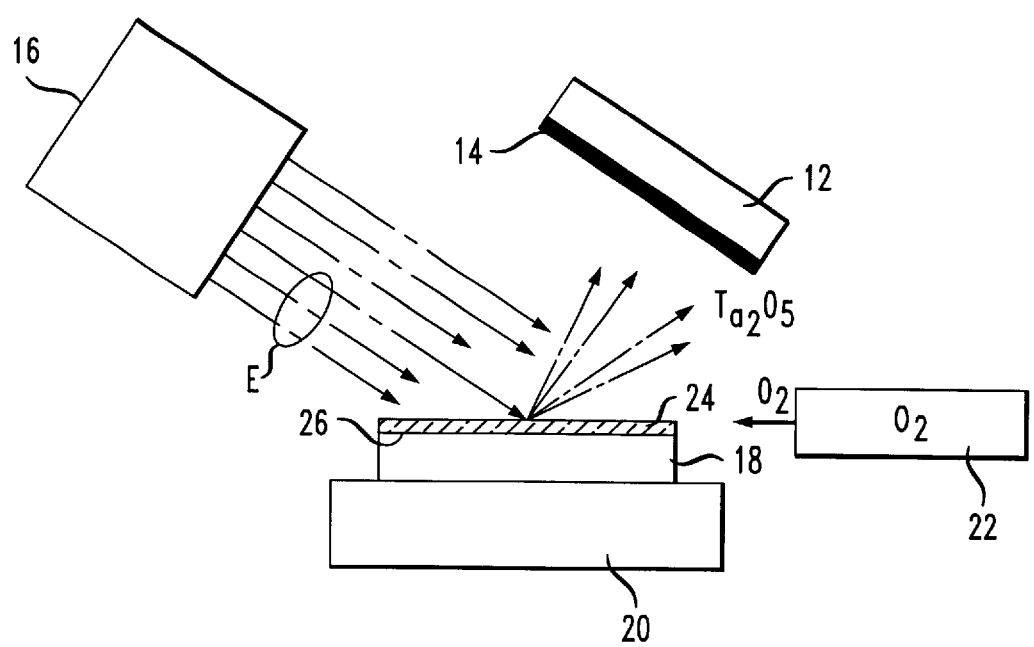
FIG. 1 illustrates an exemplary e-beam system utilizing a metallic target and oxygen source in accordance with the present invention.

FIG. 1 illustrates an exemplary system 10 useful in the inventive e-beam deposition technique of the present invention. In the arrangement as shown, a device 12 (which may be any desired optoelectronic device, bar or wafer) is to be coated with an oxide film. For the purposes of the present discussion, it will be presumed that tantalum oxide is to be deposited on device 12. In general, however, the method and apparatus of the present invention are suitable for use with any desired metal target for the deposition of the associated oxide compound, tungsten being exemplary of another useful metal target material. In that case, the system and method of the present invention may be used to deposit tungsten oxide or, in general, any metal that oxidizes easily and exhibits an oxide vapor pressure greater than that of the metal. Referring back to FIG. 1, device 12 is oriented such that a surface 14 of device 12 will be coated. System 10 further comprises an e-beam source 16 capable of generating an e-beam current, illustrated as the set of arrows "E" in FIG. 1.

In accordance with the present invention, the target material used in system 10 is a metallic target 18, in this example a metallic tantalum target. Tantalum target 18 is disposed on (or otherwise in an environment with) a heater 20, where heater 20 functions to raise the temperature of tantalum target 18 to a value associated with the vaporization of the material. An advantage of using a metallic target in accordance with the present invention is the improved thermal conduction properties of a metal when compared to the oxide targets of the prior art. That is, by using a metallic target 18, the temperature of target 18 will be more evenly distributed and, advantageously, will more quickly reach a vaporization temperature than a prior art oxide target. The improved uniformity of temperature across the surface of the wafer will also result in a more even vaporization and, therefore, deposition on surface 14 of device 12.

The required deposition of an oxide film is provided in the arrangement of the present invention by including an oxygen source 22 in system 10, where oxygen source is disposed, as shown in FIG. 1, so as to direct a stream of oxygen gas across the surface of tantalum target 18. An arrow labeled "O₂" in FIG. 1 is used to indicate the direction of the oxygen stream across target 18. In the presence of this oxygen stream, a relatively thin layer 24 of tantalum oxide ($Ta_2O_5$) will form across top surface 26 of tantalum target 18. Once oxide layer 24 is created, e-beam source 16 is activated such that the electron beams are directed toward oxide layer 24. The electron beams will release the $Ta_2O_5$ and direct it toward surface 14 of device 12.

Figure 2:
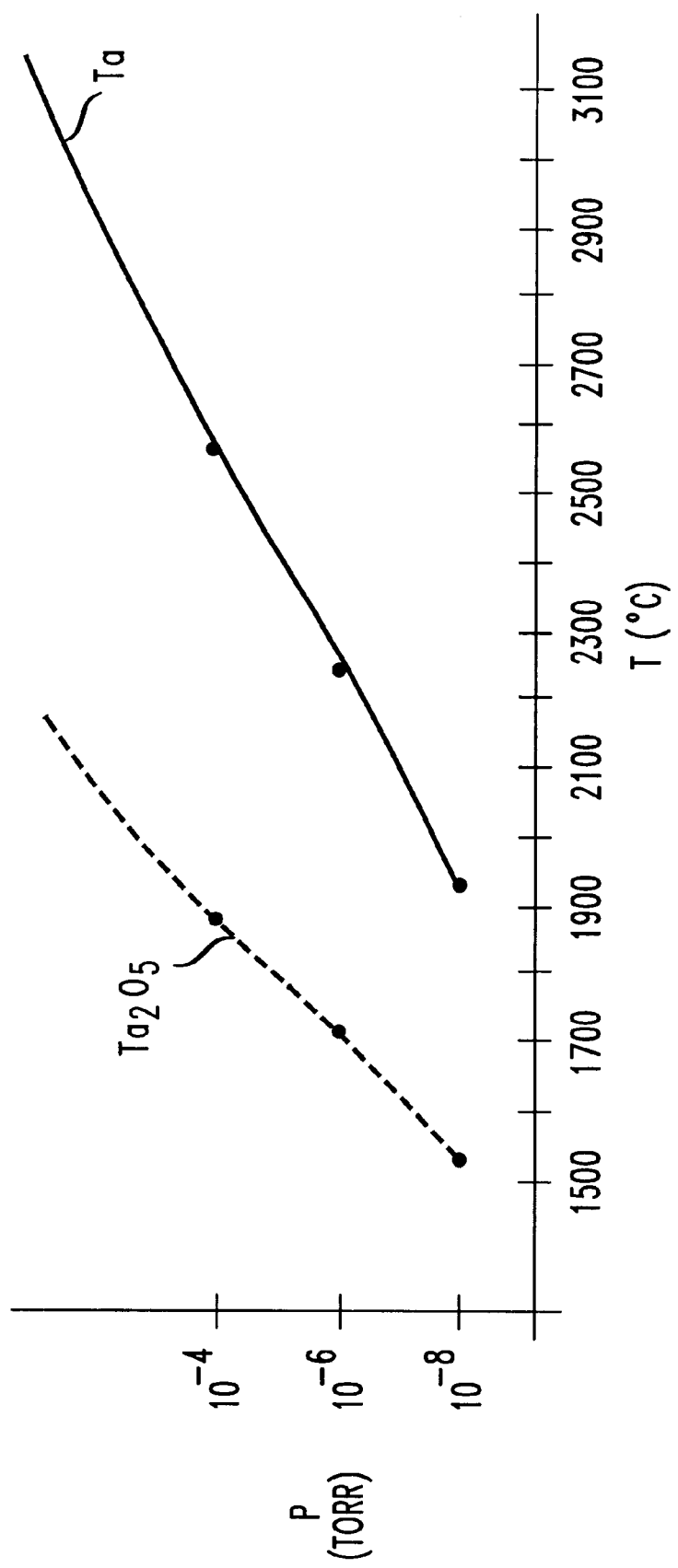
FIG. 2 contains a graph illustrating the vapor pressure of tantalum and tantalum oxide as a function of temperature.

Referring to FIG. 2, it is shown that the vapor pressure of tantalum oxide is significantly greater than metallic tantalum for various temperatures within the vaporization range. For example, at a temperature of 1920° C., the vapor pressure of tantalum is approximately $10^{-8}$ torr, where the vapor pressure of tantalum oxide is on the order of $10^{-4}$ torr. As shown in FIG. 2, this relationship remains consist over a broad range of vaporization temperatures. In accordance with the present invention, as shown in FIG. 1, the preferential vaporization of tantalum oxide with respect to tantalum insures that as the e-beam current (labeled "E") strikes tantalum oxide layer 24, this layer will vaporize first and be directed toward surface 14 of device 12. The impact of the vaporized tantalum oxide on surface 14 thereby results in the deposition of a tantalum oxide layer 28 on device 12.

When compared to the prior art technique of using an oxide target, the use of a metallic target in accordance with the present invention results in less contamination of the deposition apparatus. In particular, the use of a metallic target eliminates the need for a crucible liner (as used in the prior art) and, therefore, the possibility of target contamination by elements within the crucible is eliminated. Likewise, the volume and surface area of the heated material may be reduced when compared to the prior art, so there is less out-gassing from underlying material and neighboring "hot spots". The reduction in out-gassing reduces the contamination of the residual atmosphere in the deposition chamber.

Additionally, as mentioned above, metallic target material is usually available in higher purity form than the prior art oxide targets. Obviously, the improved purity results in a higher purity deposited film. In the prior art, to ensure uniformity and purity of the oxide starting material from run to run, it was common practice to discard the target material at the end of each run, wasting a considerable amount of target material. By using the metallic target of the present invention, there is no compositional change in the starting material and, therefore, no need to discard the target at the end of the run. The use of a metallic target in accordance with the present invention, therefore, results in a considerable economic saving when compared to the prior art process.

What is claimed is:

1. A method of depositing an oxide film on an exposed device surface, the method comprising the steps of:
    a) providing a device to be processed;
    b) providing a metallic target;
    c) heating said metallic target to a temperature sufficient to cause vaporization;
    d) forming a thin oxide layer on a surface of said heated metallic target;
    e) striking said thin oxide layer with an electron beam current so as to release vaporized oxide from said target; and
    f) deflecting said vaporized oxide toward said device provided in step a), wherein said oxide will deposit on the exposed device surface.

2. The method as defined in claim 1 wherein in performing step a), an optoelectronic device is provided.

3. The method as defined in claim 1 wherein in performing step b), a metallic tantalum target is provided.

4. The method as defined in claim 1 wherein in performing step b), a metallic tungsten target is provided.

5. The method as defined in claim 1 wherein in performing step c), the target is heated to a temperature in the range of 1500–2000° C.

6. The method as defined in claim 1 wherein in performing step d), providing an oxide stream across the target surface.

* * * * *